United States Patent [19]
Fielden et al.

[11] Patent Number: 5,323,110
[45] Date of Patent: Jun. 21, 1994

[54] TECHNIQUE FOR COMPENSATING FOR PATIENT MOTION IN MAGNETIC RESONANCE IMAGING

[75] Inventors: John Fielden; Li-Hsin Zang, both of San Jose; Jacob Wilbrink, Sunnyvale, all of Calif.

[73] Assignee: Hitachi Instruments, Inc., San Jose, Calif.

[21] Appl. No.: 927,321

[22] Filed: Aug. 10, 1992

[51] Int. Cl.$^5$ ............................................. G01V 3/00
[52] U.S. Cl. ................................... 324/309; 324/307
[58] Field of Search ............... 324/300, 307, 309, 311, 324/312, 306

[56] References Cited

U.S. PATENT DOCUMENTS

| | | | |
|---|---|---|---|
| 4,800,494 | 1/1989 | Foxall | 324/309 |
| 4,937,526 | 6/1990 | Ehman et al. | 324/309 |
| 4,978,918 | 12/1990 | Sakamoto | 324/309 |
| 5,168,226 | 12/1992 | Hinks | 324/309 |

Primary Examiner—Louis Arana
Attorney, Agent, or Firm—Flehr, Hohbach, Test, Albritton & Herbert

[57] ABSTRACT

In a magnetic resonance imaging system, object movement along an axis associated with readout magnetic gradient pulses is detected, quantized and compensated for in reconstructing an image slice. Phase-encoding magnetic gradient pulses in the sequence are arranged so that low-order phase-encoding pulses are distributed substantially uniformly during scanning time. In an N-slice acquisition, object movement is determined y arranging each of the N sets of phase-encoding gradient pulses comprising a multi-slice sequence such that at each scan time, at least one of the N sets contains a low-order phase-encoding gradient pulse. During data acquisition, echoes returned from low-order phase-encoding gradient pulses have sufficient signal-to-noise ratios to identify object position along the readout axis. Identification of object movement from one slice may be valid for other slices relatively adjacent physically in the object, so that all N slices are movement corrected during image reconstruction. Two-dimensional object position may also be identified and corrected by suitably exchanging the axes of N sets of pulses within a sequence. For a single slice acquisition, object position may be identified when scans associated with low-order phase-encoding gradient pulses are distributed evenly during imaging. After one-dimensional Fourier transformation, object position relative to a reference box function is determined using cross-correlation.

17 Claims, 11 Drawing Sheets

PHASE ENCODEING ORDER

PHASE ENCODEING ORDER

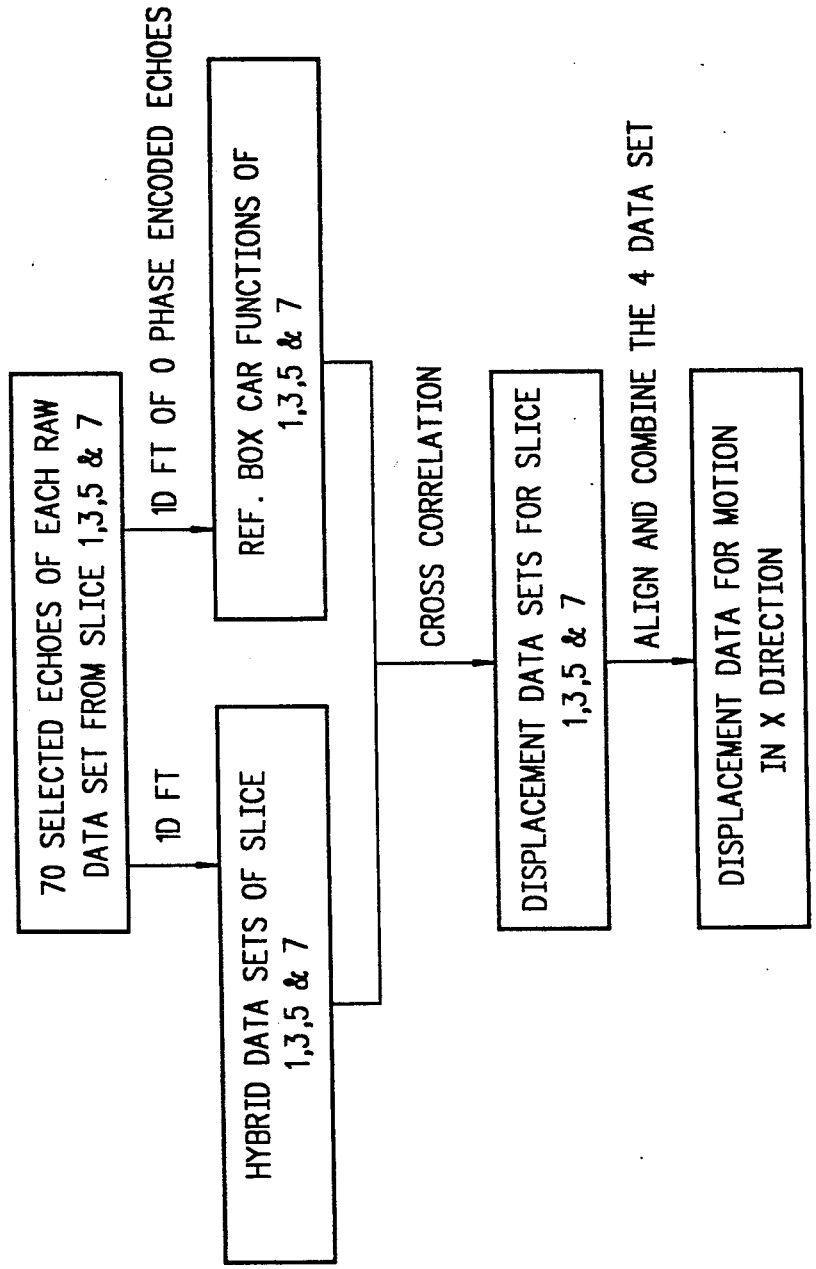

TECHNIQUE FOR COMPENSATING FOR PATIENT MOTION IN MAGNETIC RESONANCE IMAGING

FIELD OF THE INVENTION

This invention relates to magnetic resonance imaging, and more specifically to methods for compensating for patient motion in magnetic resonance imaging.

BACKGROUND OF THE INVENTION

Magnetic resonance imaging ("MRI") is a useful diagnostic procedure that analyzes changes in magnetic orientations to produce an image of an object under examination. Unfortunately, movement of the object during MRI relative to a reference position adversely affects the quality of the image produced.

FIG. 1 shows a typical MRI system 2, a system with which the present invention may be practiced. MRI system 2 includes a powerful typically superconducting magnet 4 that creates a longitudinal magnetic field $h_o$ along the z-axis when power supply 6 is energized. To promote homogeneity of field $h_o$, magnet 4 includes shim coil mechanisms (not depicted) that are coupled via bus 8 to a computer system 10 that generates appropriate corrective shimming gradient signals.

The object 12 to be imaged is placed within a radio frequency ("RF") coil 14 within magnet 4, and is thus exposed to the magnetic field $h_o$. Object 12 includes atoms whose nuclei have typically randomly oriented magnetic dipoles. During MRI, the $h_o$ field polarizes the population of such nuclei (or "spins"), causing the spins to align parallel to the magnetic field direction, here along the z-axis. A net magnetization $M_z$ results.

Computer 10 via bus 8 and RF coil 14 subjects the spins to a brief pulse of radio frequency ("RF") energy at a resonant frequency called the Larmor frequency (RF source not depicted), thus exciting the oriented spins. This excitation temporarily reorients the spin axis of the nuclei, tipping the nuclei magnetic moment towards a plane transverse to the z-axis, i.e., the x-y plane. After termination of the RF excitation pulse, the net transverse magnetization is detected (or acquired) in real time as RF signals through RF coil 14 and a receiver (not depicted).

These signals are digitized (digitizing mechanism not depicted) and coupled to computer 10 for processing. The acquired raw RF signals include magnetic field gradient information, and represent the spatial frequency information domain, or so-called raw k-space data matrix (or array). By using Fourier transformation upon the raw k-space data matrix, a reconstructed image 16 of object 12 may be obtained and displayed on monitor. However, if object 12 moved during scanning, the quality of image 16 can be degraded.

The amplitude of the detected nuclear magnetic resonance ("NMR") signal depends upon the degree of RF excitation and the relaxation properties of the spins. During imaging, computer system 10 controls magnetic field gradients $G_x$, $G_y$, $G_z$ along the x, y, z axes that are needed to spatially correlate locations of the spins in object 12.

Typically 256 y-axis gradient levels are used during an MRI scan, which levels (or phase encoding steps) range from $-128$ through 0 to $+128$, where the 0th phase encoding for a slice refers to the line (or "echo") having no phase encoding gradient. Each line or echo will comprise 256 points that correspond to one step along the y-axis in the so-called k-space (or momentum space) domain. Essentially these gradient levels allow system 2's sensitivity to be limited to a single x-y plane slice along the z-axis.

By suitably controlling the gradient strengths $G_x$, $G_y$, $G_z$ during each MRI image cycle, the spatial distribution of nuclei spin excitation may be controlled, and the location of the resulting NMR signals can be identified. The NMR data for reconstructing images may be collected using several known techniques, including multiple angle projection reconstruction and Fourier transform. Such techniques typically comprise a pulse sequence made up of a plurality of sequentially implemented views. Each view may include one or more NMR experiments, each using an RF excitation pulse and a magnetic field gradient pulse to encode spatial information into the resulting NMR signal. As is understood by those skilled in the relevant art, the NMR signal may be a free induction decay or, preferably, a spin-echo signal.

As further understood by those skilled in the relevant art, low frequency information including motion information is present only in the center of the raw k-space data, with higher frequency information appearing at the beginning and end of this data matrix.

Computer system 10 uses the gradient magnetic field information to identify where spatially the intensity values represented by the acquired k-space radio data belong. Such techniques are commonly found in clinical MRI systems using two dimensional multi-slice imaging sequences, wherein the acquisition of the data for the slices is interleaved in time.

Computer system 10 transforms the k-space data to a real space image using conventional spatial Fourier transform methods. The real space image 16 may then be displayed on a monitor 18, to show contrast changes as a function of x-axis and y-axis positions. Typically image 16 depicts a "slice" of object 12 in the x-y plane, at chosen different locations along the z-axis.

If object 14 moves during imaging (depicted by dashed lines 20), so-called motion artifacts result that can degrade the quality of the reconstructed image 16. However if object 12 motion could be measured, it would be possible to compensate for that movement and generate an improved reconstruction image.

Although the k-space data includes information that can identify object movement, it has been difficult in the prior art to measure such movement directly from the k-space data at all times during the scan. This difficulty arises because, as depicted in FIG. 2, the signal to noise ("S/N") ratio is poor during most of the image scan time.

FIG. 2 depicts a normal prior art collection of k-space data for a single slice along the z-axis. Assume that a total of 256 lines are to be scanned from time 0 to time 256, wherein one scan acquires data for one line. As noted, each line will have 256 data points that correspond to one k-space step along the y-axis, and collectively the 256 lines represent 256 magnetic field gradient levels along the y-axis. According to the prior art, the same acquisition order is used for each slice, e.g., here $-128$, through 0 to $+127$.

According to FIG. 2, although the scan starts at time $t=0$ (or line $-128$) when possibly object 10 movement occurs, the S/N is relatively low (e.g., poor) and artifact movement signals cannot be readily detected. It is not until about time $t=96$ to time $t=159$ that the S/N ratio improves adequately, with time $t=128$ (corresponding to line 0) representing peak S/N ratio. Thus t=128, which corresponds to a low order phase gradient (e.g., 0) representing low frequency data, when the center portion of the k-space data is acquired represents the best time to detect artifact signals representing motion, because at all other acquisition times the S/N is relatively inadequate.

Within this region of high S/N, object 12 movement could be detected, the movement displacement could be calculated, and a suitable correction could then be made computer system 10, using well known techniques, to improve the quality of the displayed reconstructed image 16. Unfortunately, however, object movement that occurred during time t=0 to time t=95, as well as movement occurring between time t=159 to t=256 will go unrecognized because the artifact signal is too submerged in the noise, due to poor S/N. Thus no displacement can be ascertained, no correction can be generated for such movement, and the resultant display image quality remains degraded. Stated differently, prior art approaches such as depicted in FIG. 2 are "blind" to object movement occurring other than at the period of optimum S/N.

One prior art attempt to reduce motion artifacts in a magnetic resonance imaging system is set forth in U.S. Pat. No. 4,937,526 issued to Ehman, et al. (1990). Applicants incorporate Ehman, et al. herein by reference, as this patent provides a very detailed description of MRI theory, accompanied by numerous explanatory figures.

Ehman, et al. discloses a method wherein additional RF and magnet gradient pulses are generated to create a second data matrix (in k-space) having a maximum S/N at all lines. This second matrix is then used to provide positional information identifying artifact movement. The positional change information is then used to improve the resultant image quality.

While Ehman, et al.'s system improves image quality, the improvement requires considerable overhead. For example, Ehman, et al.'s technique requires additional imaging time due to the necessary generation of additional RF and gradient pulses. Further, Ehman, et al. generates essentially twice the amount of initial k-space data to be stored in memory 14, and presents additional data to be processed by computer system 10, which processing requires additional time.

What is needed for MRI is a method that can recognize and compensate for object 12 motion, utilizing the k-space data itself generated during normal MRI scanning. Preferably such method should not require that memory 14 be increased beyond what is needed to store the image k-space data itself, should not require the generation of additional RF and gradient pulses (thereby not extending imaging time), and should not impose substantial additional processing time upon computer system 10. Such a method preferably should measure object translational movement in the readout direction by self-calibration, using only high S/N echoes from different slices. The present invention discloses such a method.

SUMMARY OF THE PRESENT INVENTION

The present invention provides methods for compensating for artifact motion in magnetic resonance imaging, without requiring additional computer memory beyond that needed to store the conventional k-space data, without requiring additional RF and gradient pulses, and without imposing substantial additional computational requirements. As such, the present invention may be used with existing MRI systems. As noted, although the raw k-space data matrix includes information needed to identify artifact motion, the signal/noise ("S/N") ratio throughout the matrix is not sufficiently to allow accurate object position determination.

The present invention provides a measure of translational object motion in the readout direction by self-calibration, wherein only the high S/N ratio echoes are used. Essentially the present method offsets the starting phase encoding number of each slice in a two-dimensional multi-slice imaging system. This permits acquisition of high S/N echoes (from different slices) to be spread out reasonably evenly during the entire imaging time period. Assuming that each slice is displaced by the same amount in the readout direction, object displacement data from one slice may be used to correct displacement in other slices. The method works especially well when a small number of relatively thin slices are used to cover a small physical volume.

A first embodiment is directed to single axis motion correction. In this embodiment, the order in which the raw k-space data (e.g., phase encodings) for each slice is acquired is rearranged to distribute low-order phase encodings uniformly throughout the time of the scan. This rearrangement allows estimates of object displacement in one dimension, using low-order (e.g., high S/N ratio) phase encoding echoes.

Other preferred embodiments are directed to two-axis motion correction for multi-slice imaging. For example, a second embodiment uses a different phase encoding order for each slice. Data acquisition for each slice starts with a different phase encoding number, using interleaving, and within each slice, the phase encoding number is sequentially incremented by one (modulo the total number of echoes) for each echo. Again, object position is estimated from each slice's low-order (e.g., high S/N) phase encodings. A final displacement curve (displacement vs. time) is obtained by combining the position information obtained from all slices. This final motion data will be used to correct motion for all slices. Time interpolation of these position measurements, or displacement data, is used to obtain the shift values for high-order phase encoding echoes that were acquired between two neighboring points.

Furthermore, different readout directions for different slices may be used, to allow object positional measurement in two dimensions. For example, the first slice may have an x-axis readout direction and a y-axis phase encode direction. The second slice would have y-axis readout direction and x-axis phase encode direction.

Object position is then estimated from each radio frequency ("RF") echo by using edge information obtained from the modulus of the one-dimensional Fourier transform of that echo. As used herein, "modulus" means the vector sum of a complex value, for example, the modulus of $A+iB$ being $(A^2+B^2)^{\frac{1}{2}}$. The positional information is then used to correct the raw data using Fourier shift methods, so that the reconstructed image corresponds to one position of the object, with minimal motion artifacts being displayed. In contrast to the prior art, according to the present invention, object movement can be detected and measured at several sample time intervals, and essentially no "blind" regions are encountered.

Other features and advantages of the invention will appear from the following description in which the preferred embodiments have been set forth in detail, in conjunction with the accompanying drawings.

BRIEF DESCRIPTION OF THE DRAWINGS

FIG. 9 is a flow chart depicting motion detection and measurement of object motion along two axes, according to the present invention;

DETAILED DESCRIPTION OF THE PREFERRED EMBODIMENT

Applicants have discovered that to meaningfully use the information contained in a conventional multiple slice, k-space data array to identify artifact motion, it is necessary to rearrange the order in which data for each slice are acquired, or collected.

According to the present invention, rearrangement is such that the low-order phase encodings (e.g., high S/N, corresponding to center of k-space) are distributed reasonably uniformly throughout the time of the scan. As a result, high S/N information is available at any time during imaging. This advantageously permits motion recording using high S/N ratios echoes to be made for the entire imaging period. Applicants, invention with its re-ordered phase encodings is compatible with any of the standard magnetic resonance imaging pulse sequences, including multi-slice spin echo, fast spin echo, and gradient echo.

Object position is then estimated from each radio frequency ("RF") echo by using the modulus of the one-dimensional Fourier transform of that echo, using edge detection information, in one or in two dimensions. The positional information is then used to correct the MRI image data so that the reconstructed image corresponds to one position of the object, with minimal motion artifacts being displayed.

Figure 4:
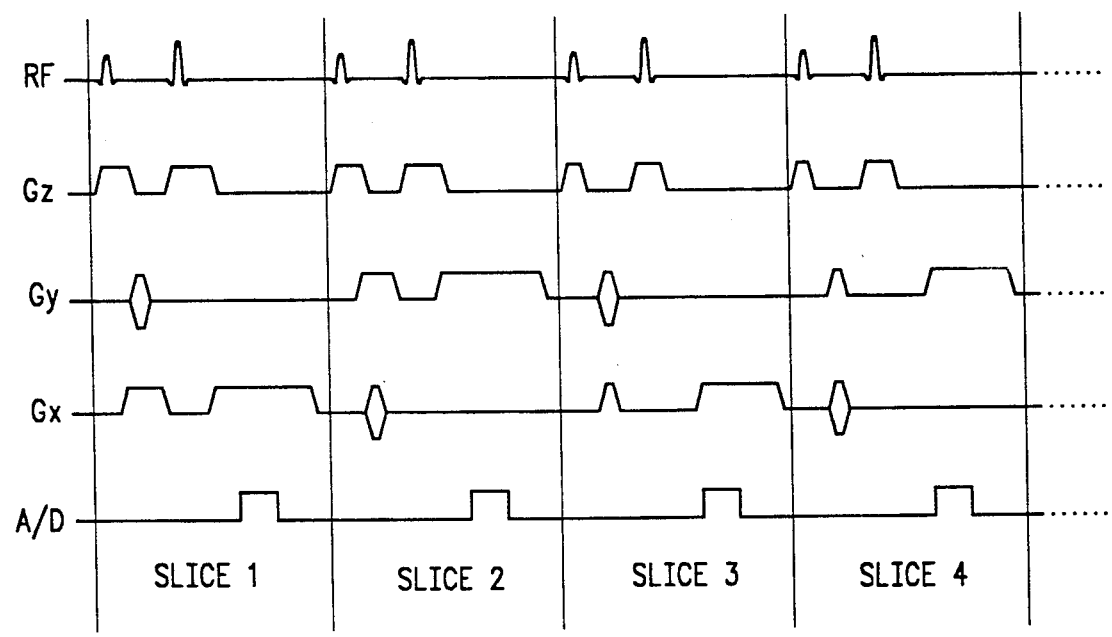
FIG. 4 depicts a spin-echo pulse sequence for multi-slice two-dimensional imaging, wherein object motion is detected and measured along the x-axis and y-axis according to a second embodiment of the present invention.

FIG. 4 schematically depicts the spin-echo pulse sequence for four image slices, for a second preferred embodiment wherein motion detection and measurement is provided a both x and y axes. While only four image slices are depicted, thereafter additional slices may be added by repeating these four slice as long as the cycle time (TR) permits. As will be understood by those skilled in the art of MRI, the RF pulse train shows a relatively small 90° pulse, followed by a larger 180° pulse. The various gradient signals are denoted $G_x$, $G_y$, $G_z$, and A/D denotes the time when data are collected. In FIG. 4, alternate slices have their phase encoding directions in the y-axis and x-axis directions. While FIG. 4 depicts four slices, it is understood that a different number of slices could be used if desired.

For the embodiment depicted in FIG. 4, the collection order of phase encodings in a single slice is rearranged to provide a more reasonably uniform time distribution of low order phase encodings. For example, one collection order for phase encodings of a 256 phase encoding image, wherein one in every four phase encodings lies in the optimal range −32 through +32: −128, 0, −64, +64, −127, +1, −63, +65, −126, +2, −62, +66, and so forth.

In the above sequence, [−128, 0, −64, +64] are data for the first four echoes, [−127, +1, −63, +65] represent data for the second set of echoes, and so forth. Although other orderings are possible, it is desirable to maintain the phase encoding order monotonic (modulo the total number of phase encodings), to avoid introducing strong artifacts from uncorrected object 12 motion.

Figure 5:
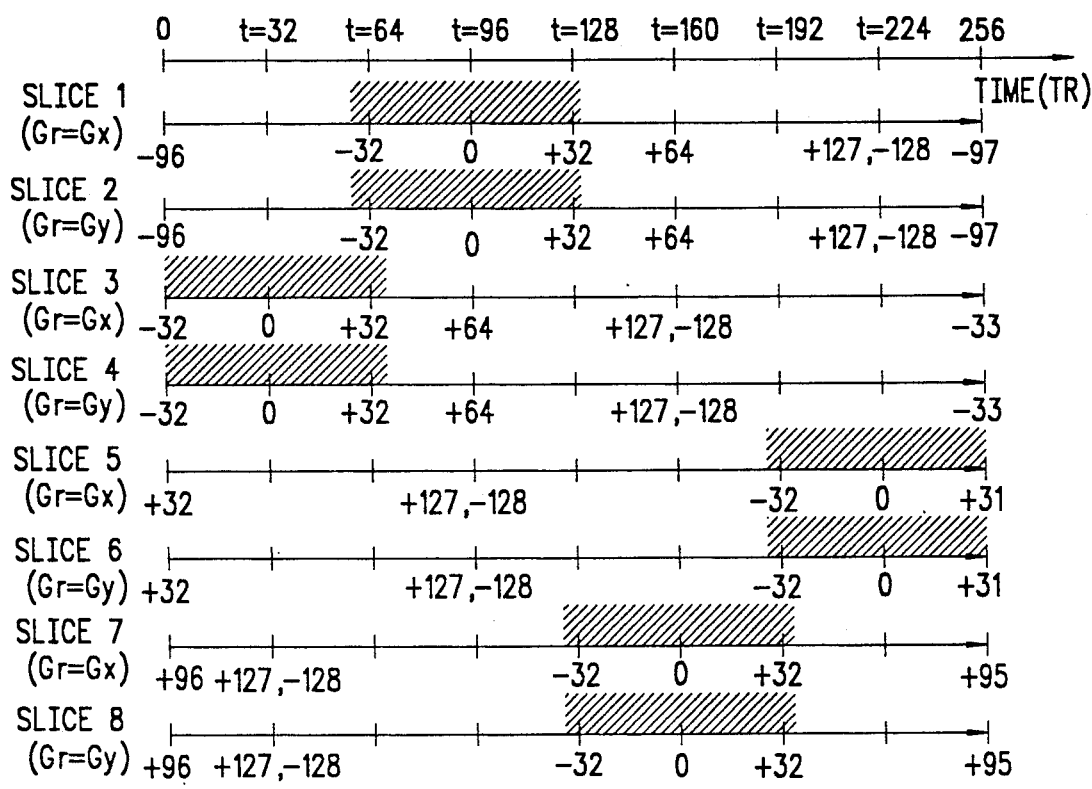
FIG. 5 depicts a preferred phase encoding order used with the image pulse sequence of FIG. 4, wherein object motion is detected and measured along two axes, according to a second preferred embodiment of the present invention.
Figure 6:
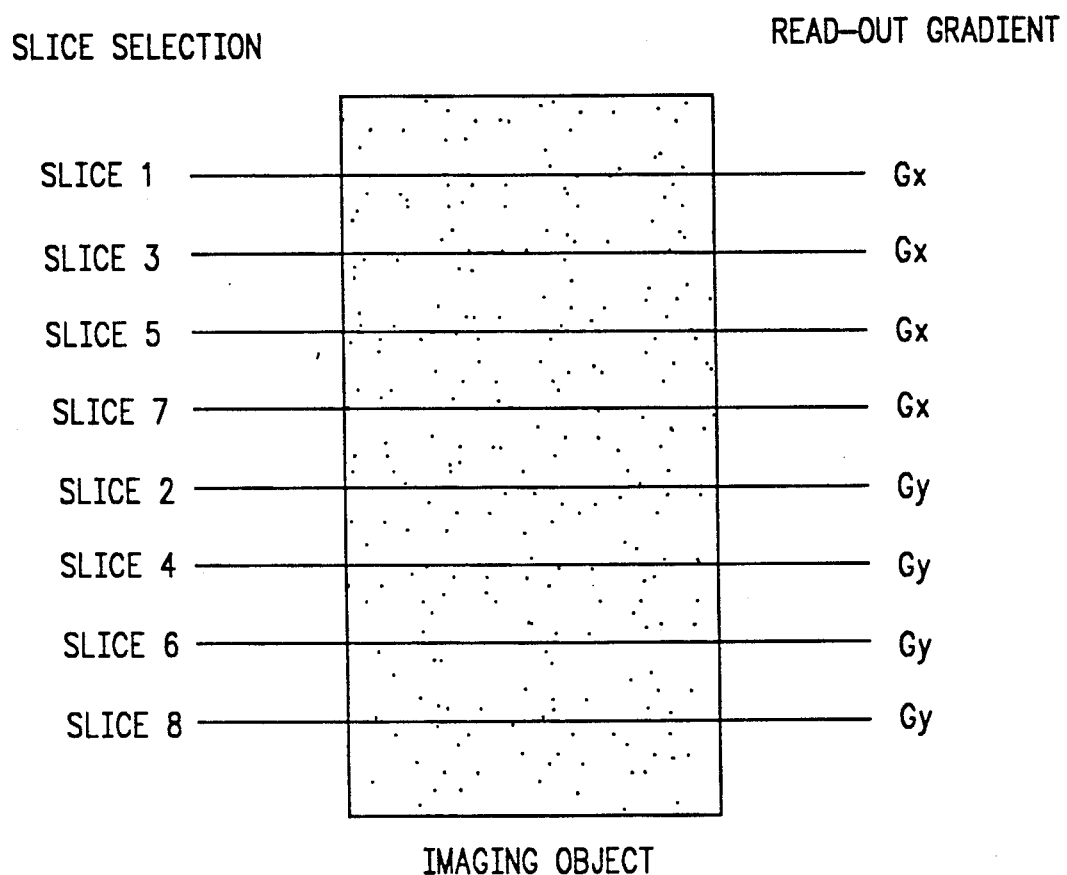
FIG. 6 depicts the relationship between image slices and readout gradients for the embodiment of FIG. 5, according to the present invention.

FIG. 5 depicts the preferred phase encoding order used for the image pulse sequence shown in FIG. 4, while FIG. 6 depicts the relationship between image slices and readout gradients for the same embodiment. Preferably a monotonic phase encoding order is maintained with multi-slice images by using a different ordering for the phase encodings in each slice. In FIG. 5, the collection order of phase encodings in a single slice is rearranged to provide a more reasonably uniform time distribution of low order phase encodings. In FIG. 5, the cross-hatched "rectangles" schematically denote regions of high S/N, for example during acquisition of k-space regions −32 through 0 through +32. FIG. 5 depicts one collection order for phase encodings of a 256 phase encoding image, wherein one in every four phase encodings lies in the optimal range −32 through +32: −96, −32, +32, +96, −95, −31, +33, +97, −94, −30, +34, +98, −93. −29, +35, and so on.

It should be appreciated that eight images are simultaneously acquired, wherein four images are acquired from the x-axis, and four images are acquired from the y-axis. With respect to the above phase encodings, [−96, −32, +32, +96, −95, −31, +33, +97] represent, respective, four x-dimension and four y-dimension slice of the same respective four images, and so forth. Note that the preferred encoding is such that the first four slices are acquired 64 "units" apart, e.g., during high S/N, and that +1 is added to the phase encoding in going from an image's first slice to that image's second slice, e.g., in going from −96 to −95, then to −94, and so on.

Figure 1:
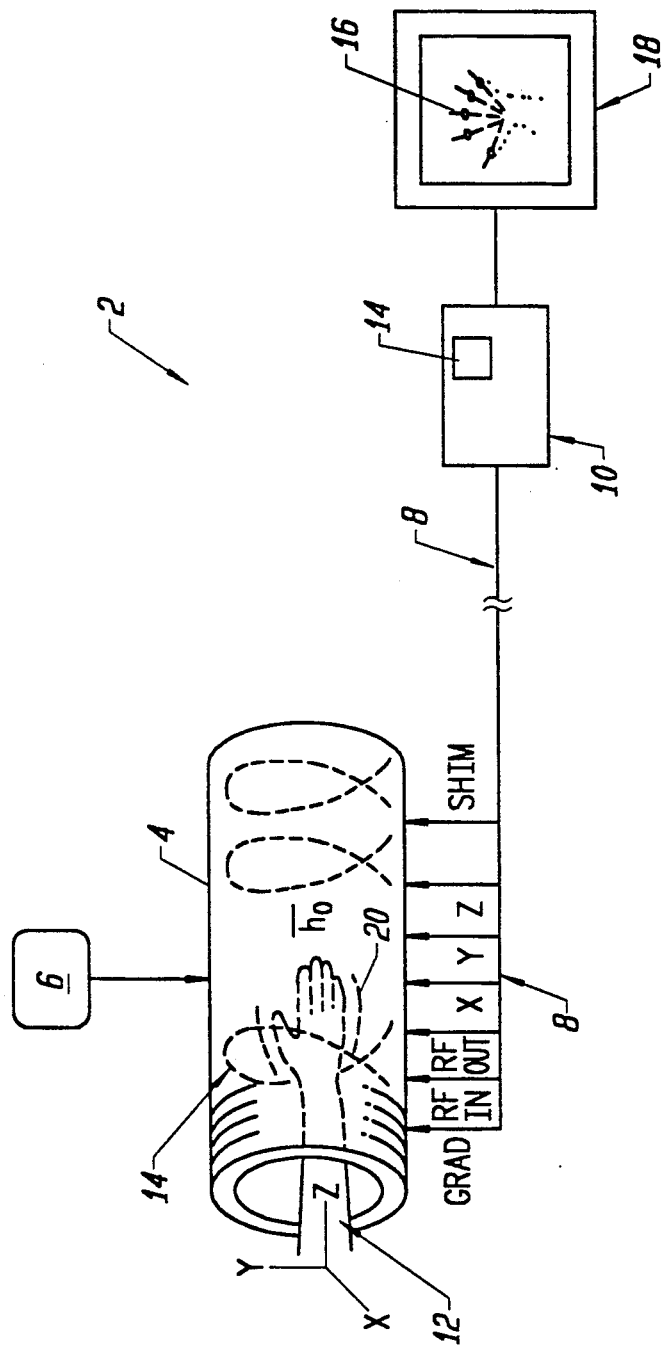
FIG. 1 depicts a conventional magnetic resonance imaging system, a system with which the present invention may be practice.
Figure 2:
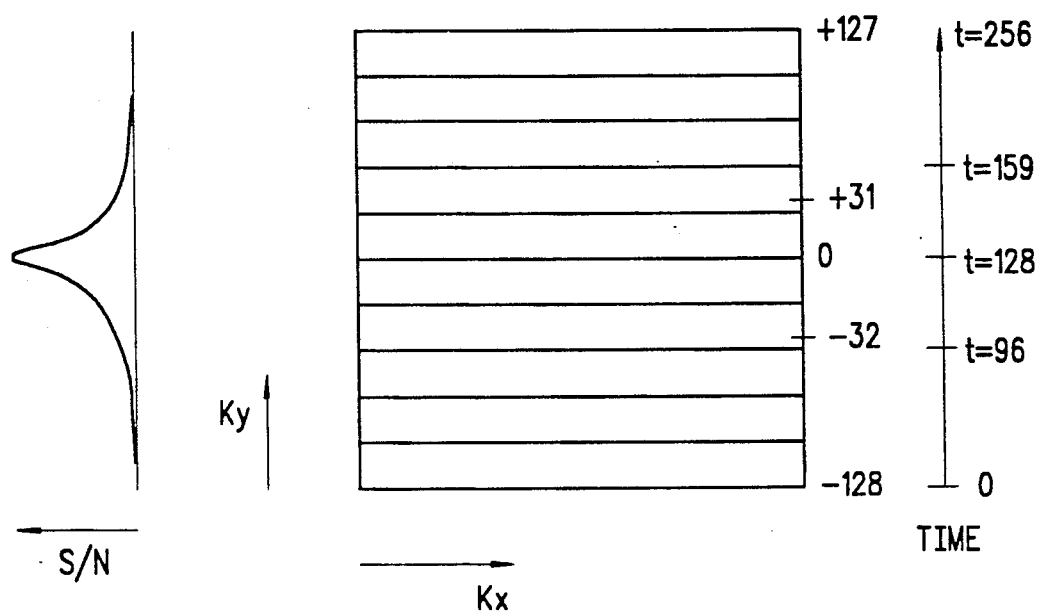
FIG. 2 depicts a raw data (or k-space) matrix, showing acquisition order for two-dimensional imaging in a conventional magnetic resonance imaging system wherein the same acquisition order is used for each slice for multi-slice imaging using interleaving.

Note from FIG. 5 that at any given time, at least one slice is being acquired that has optimum S/N. For example, object 12 motion occurring during time $0 \leq t \leq 64$ may be recognized and quantized because slice 3 and slice 4 each experience high S/N during that time interval. However if movement occurred, for example, during $64 \leq t \leq 96$, then detection and measurement of such movement is possible because during this time interval, slices 1 and 2 each experience high S/N. Thus, unlike the prior art approach of FIG. 2, wherein there were "blind" regions at $0 \leq t \leq 96$ and at $156 \leq t \leq 256$ that precluded movement detection and measurement, the present invention has no blind spots.

Although many other orderings are possible, it is nonetheless desirable to maintain the phase encoding order monotonic (modulo the total number of phase encodings) to avoid introducing strong artifacts from uncorrected object 10 motion. Note from FIG. 5 that preferably there are no discontinuities that could introduce artifacts in acquiring data from one slice to another slice.

Note from FIG. 6 that slices 1, 3, 5, and 7 are readout using the $G_x$ gradient, and slices 2, 4, 6, and 8 are readout using the $G_y$ gradient.

Figure 7:
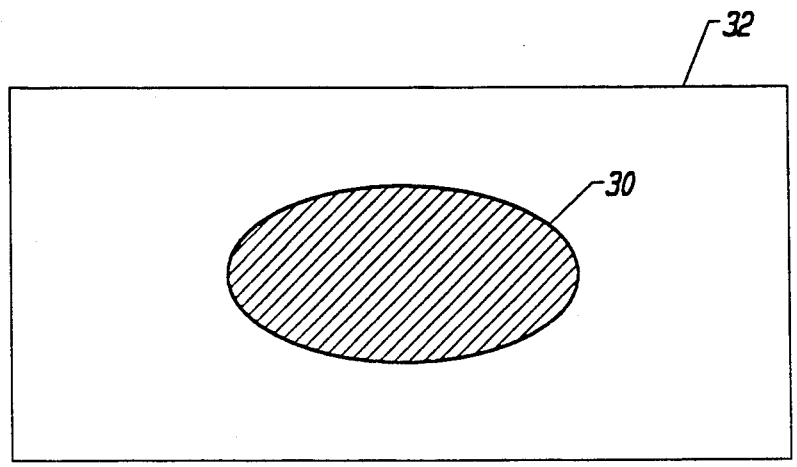
FIG. 7 depicts readout direction so orientated that the region of the object being imaged is totally enclosed within the field of view, according to the present invention.

It is understood that the readout direction is to be oriented such that the region of the object being imaged is totally enclosed within the field of view, this requirement being depicted in FIG. 7. In FIG. 7, the cross-section slice of object 10 is denoted as 30, whereas the field of view of the image acquired is denoted as the bounding box 32.

As noted, other readout arrangements are possible as it is not necessary that the slice data be collected in sequential order, or that the starting phase encodings be arranged in order. For example, for an eight-slice image with 256 phase encodings (i.e., phase encoding numbers ranging from −128 to +127), the following acquisition sequence could be used wherein a 32 echo sequence is employed:

| | |
|---|---|
| Slice 1, phase encoding | 0 |
| Slice 2, phase encoding | −32 |
| Slice 3, phase encoding | −64 |
| Slice 4, phase encoding | −96 |
| Slice 5, phase encoding | −128 |
| Slice 6, phase encoding | 96 |
| Slice 7, phase encoding | 64 |
| Slice 8, phase encoding | 32 |
| Slice 1, phase encoding | 1 |
| Slice 2, phase encoding | −31 |
| Slice 3, phase encoding | −63 |
| etc. | |

For example, for the same number of slices and phase encoding as discussed above, another useful acquisition sequence could be:

| | |
|---|---|
| Slice 1, phase encoding | −112 |
| Slice 2, phase encoding | −80 |
| Slice 3, phase encoding | −48 |
| Slice 4, phase encoding | −16 |
| Slice 5, phase encoding | 16 |
| Slice 6, phase encoding | 48 |
| Slice 7, phase encoding | 80 |
| Slice 8, phase encoding | 112 |
| Slice 1, phase encoding | −111 |
| Slice 2, phase encoding | −79 |
| etc. | |

In this manner, the present invention avoids artifacts that arise when the first phase encoding collected on a slice is phase encoding number zero.

However the above scheme could result in one slice causing weak artifacts on the next slice, due to imperfect slice profiles, especially where a zero order phase encoding is followed by an echo. However those skilled in the relevant art will appreciate that standard MRI techniques exist to reduce this effect. For example, one such known technique is simply not to collect slices in the same order as their physical positions in space. Another technique is to use tailored RF pulses and slice selection gradient waveforms that produce better slice profiles. Yet another known technique is to tailor the gradient waveform shapes to minimize the generation of stimulation echoes. Those skilled in the art further recognize that combinations of these techniques may be used as well.

The modulus of the one-dimensional Fourier transform of each echo must be computed to measure the position of the object under examination, here object 10. A reference echo is needed for each slice, which reference echo may normally be selected as the 0th phase encoding for that slice, i.e., the echo with no phase encoding gradient. The position of object 10 has to be measured from each reference echo, which measurement can be done with a simple threshold, such as an edge detection algorithm.

Figure 8:
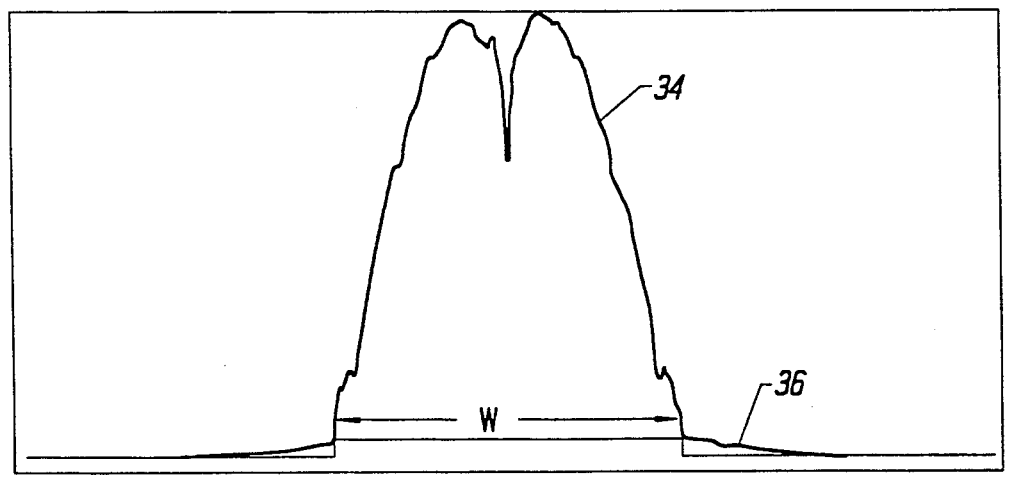
FIG. 8 depicts a box-car function superimposed on the one-dimensional Fourier transform of the object echo, where the box-car function is used as a reference for motion detection, according to the present invention.

To either side of the object 12, the one-dimensional transform will be just noise, but within object 12 there will be finite signal with noise superposed. This S/N relationship is depicted in FIG. 8. In FIG. 8, the modulus of the one-dimensional Fourier transform of the reference echo (e.g., 0th phase encoding) 34 is plotted against the box-car function 36 corresponding to the width (W) of object 12. The object width (W) is determined by the left-most and right-most positions where the transform crosses a threshold value, the box-car height indicating the threshold value chosen.

The position of the object 12 as a function of time can be determined by comparing each of the moduli of the transforms of the echoes with the modulus of the transform of the reference echo. Prior art comparison techniques, such as that proposed by Felmlee, et al. in *Radiology* 179, pp. 139–142 (1991) wherein threshold detection determines the boundaries of the non-zero signal region of each transformed echo, suffer from several drawbacks. Felmlee, et al.'s technique does not work well for in vivo measurements, as signals from all phase encodings are weak except for the 0th phase encoding. Also, simple threshold techniques tend to be sensitive to noise as the threshold level must be lowered to match the reduced signal levels.

By contrast, applicants' position measuring algorithm uses a box-car function derived from the 0th phase encoding, as depicted in FIG. 8. The box-car function is zero outside the object, and has a constant non-zero value (conveniently taken to equal one) inside the object. This box-car function is cross-correlated with the moduli of the transforms of all the echoes, except the reference. The positions of the maxima of the cross-correlations indicate the positions of the object 10 at the times of those echoes. This position information can be used to reduce the effects of motion by correcting the phase of the data. Various publications by Felmlee, et al. disclose such phase correction, including U.S. Pat. No. 4,937,526 (1990), *Radiology* 179, pp. 139-142 (1991), and *Magnetic Resonance Imaging*, 8S1, p. 25 (1990).

As noted, high-order phase encodings do not have sufficient S/N ratio to allow accurate estimation of displacement at the time of those echoes, and thus the present invention uses information from one slice to correct other slices. Because of the order of acquisition of the phase encodings, at any time at least one of the slices has echoes with high S/N ratios.

According to the present invention, using position information from one slice to correct another requires knowledge of the relative positions of the edges of the two slices. This information can be obtained by using position measurements on the two slices made at similar times. If extra 0 phase encoding echoes are included at the start of the imaging sequence, these can be used to make the relative position measurements. Alternatively, regular phase encodings may be used for the measurements.

Optionally, if desired one could smooth out position measurements as a function of time since in practice object 10 movements are relatively infrequent.

The present invention may be extended to measure position in two dimensions by interchanging the directions of the readout and phase encoding directions on alternate slices. For example, on slices 1, 3, 5 and 7 the readout gradient can be in the x direction and phase encoding gradient can be in the y direction, whereas on slices 2, 4, 6 and 8 the phase encoding gradient can be in the x direction and the readout gradient in the y direction. The above-described method is then applied separately for the odd and even-numbered slices. The y positions of the odd-numbered slices are interpolated from the measurements made on the even-numbered slices, and the x positions of the even-numbered slices are interpolated from the odd-numbered slices.

Motion measurement and correction according to the present invention may advantageously be used in conjunction with other numerical techniques, for example to obtain initial estimates of the position of object 12. Further numerical techniques such as the algorithm described by R. W. Gerchberg and W. O. Saxton in Optik, 35, pp. 237-248 (1972) may be employed to improve those position estimates. In many cases such numerical algorithms do not work unless the initial position estimates are reasonably accurate.

FIG. 9 is a flow chart depiction of the present invention showing determination of displacement along a given axis, here the x-axis. In FIG. 9, it is understood that the nomenclature "1D FT" denotes the one-dimensional Fourier transform, and that by practicing the procedure shown, displacement of object 12 along the x-y plane may be ascertained. In FIG. 9, using the hybrid data sets and reference box car functions, cross-correlation occurs to yield the displacement data sets. The displacement data sets are aligned and the four data sets are combined to yield the displacement data for motion in the x-axis direction. Of course, it is understood that the same procedure is followed using echoes from slices 2, 3, 4 and 8 to obtain displacement data for y-axis direction motion.

Figure 10A:
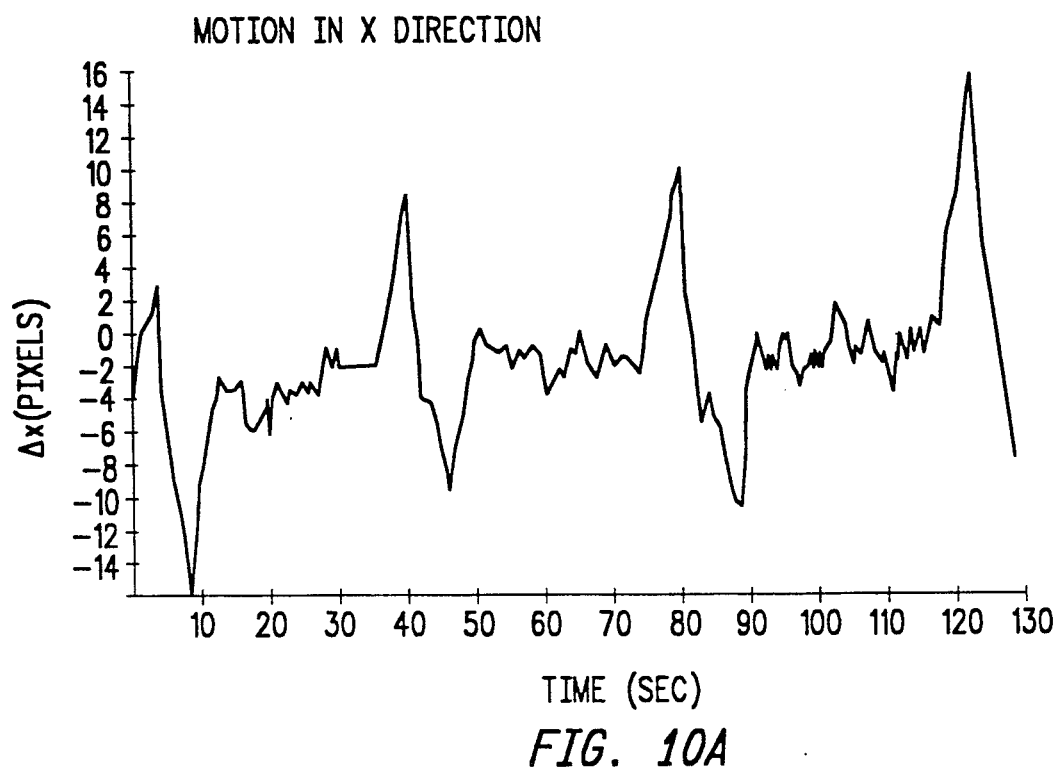
FIGS. 10A and 10B depict measured displacement data along the x-axis and y-axis, using the present invention.
Figure 10B:
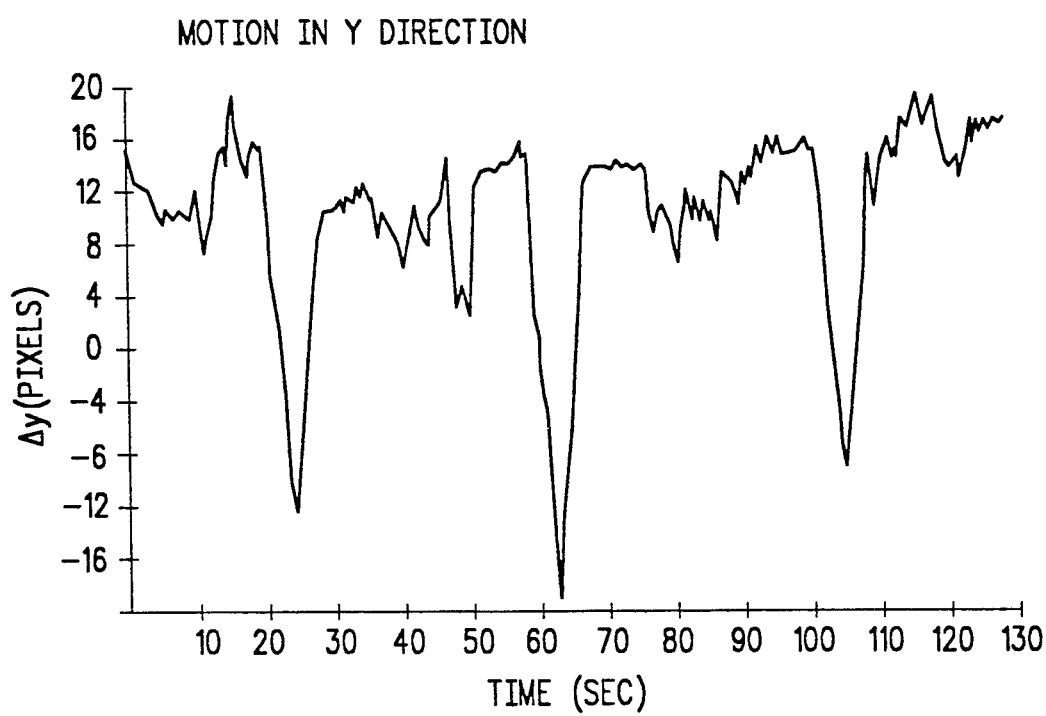

FIGS. 10A and 10B depict actual test data showing determination of object 12 displacement along the x-axis and y-axis, according to the present invention. In obtaining the data depicted, a test subject's knee was examined, and the subject was instructed to move his knee alternatively along one axis, and then along the other axis. However simultaneous movement of object 12 along the x-y plane could be similarly detected and measured, according to the present invention.

Figure 11B:
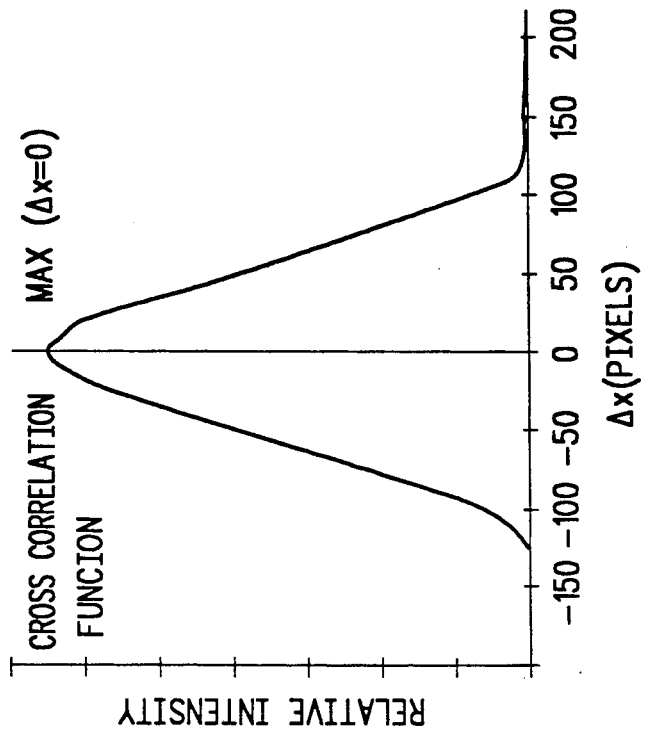
FIGS. 11A-B, and 11C-D depict, respectively, a one-dimension Fourier transform of 0th and 32nd phase coding echoes, and the corresponding cross-correlation function with a reference box-car (displacement expressed in video pixel units)
Figure 11A:
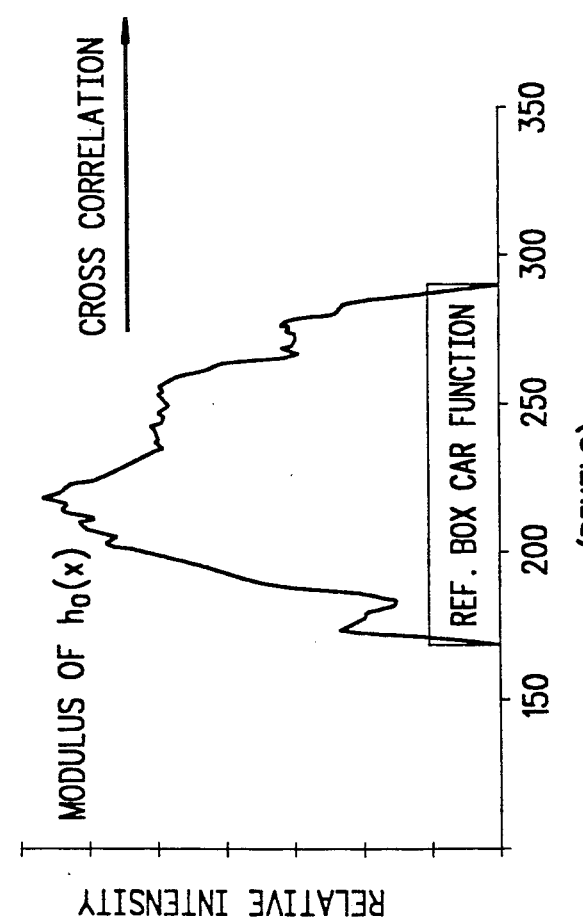
Figures 11C, 11D:
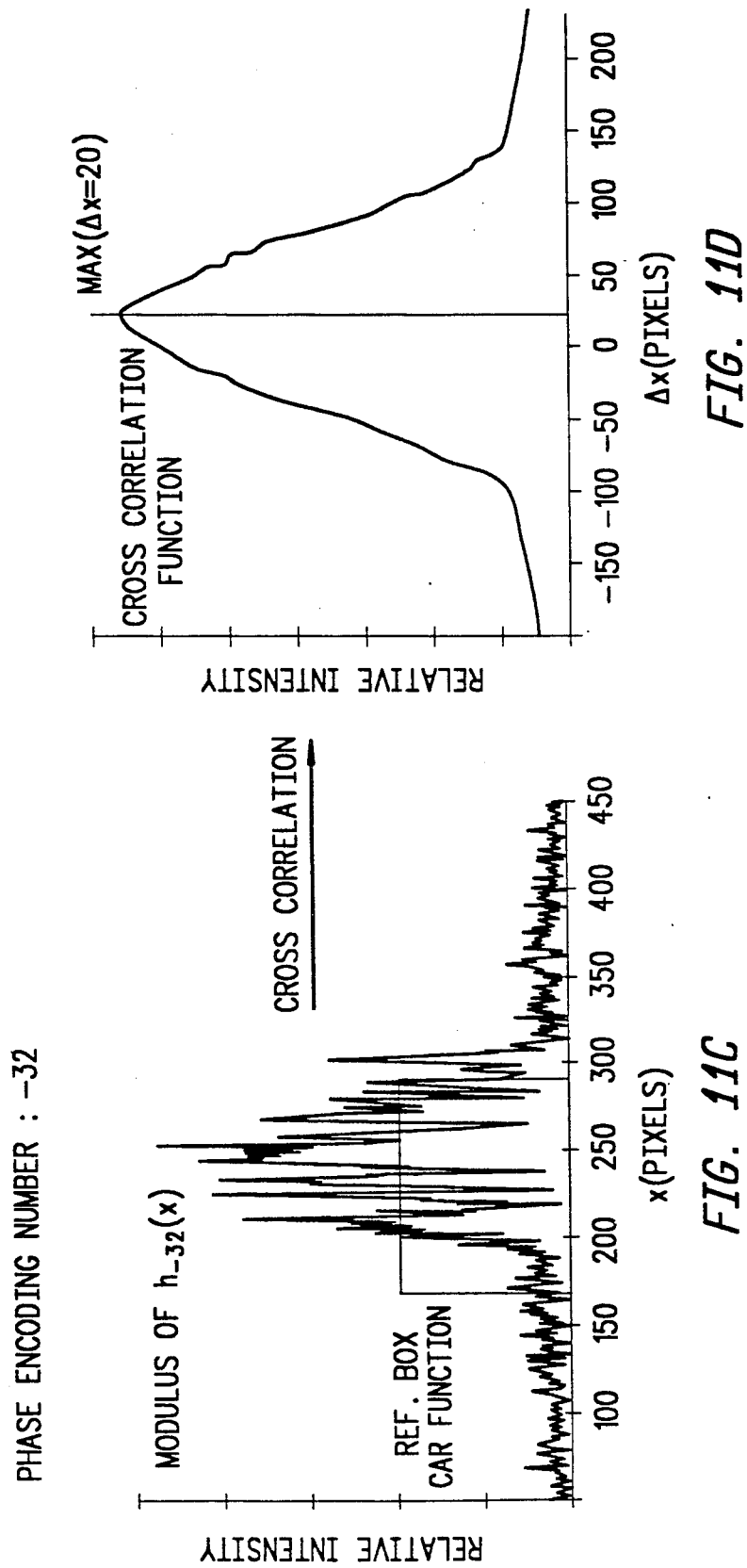
Figures 3A, 3B:
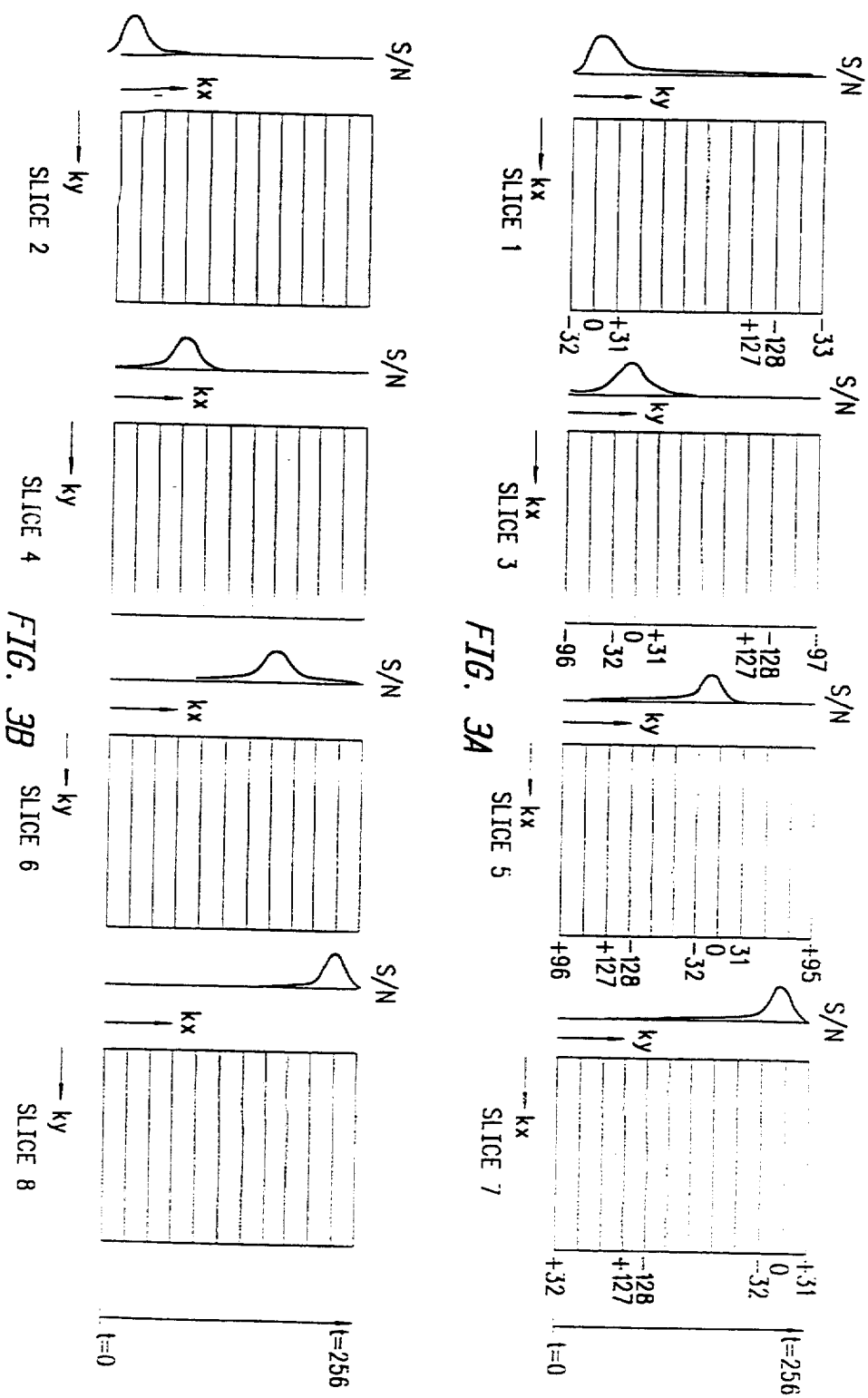
Figure 5:
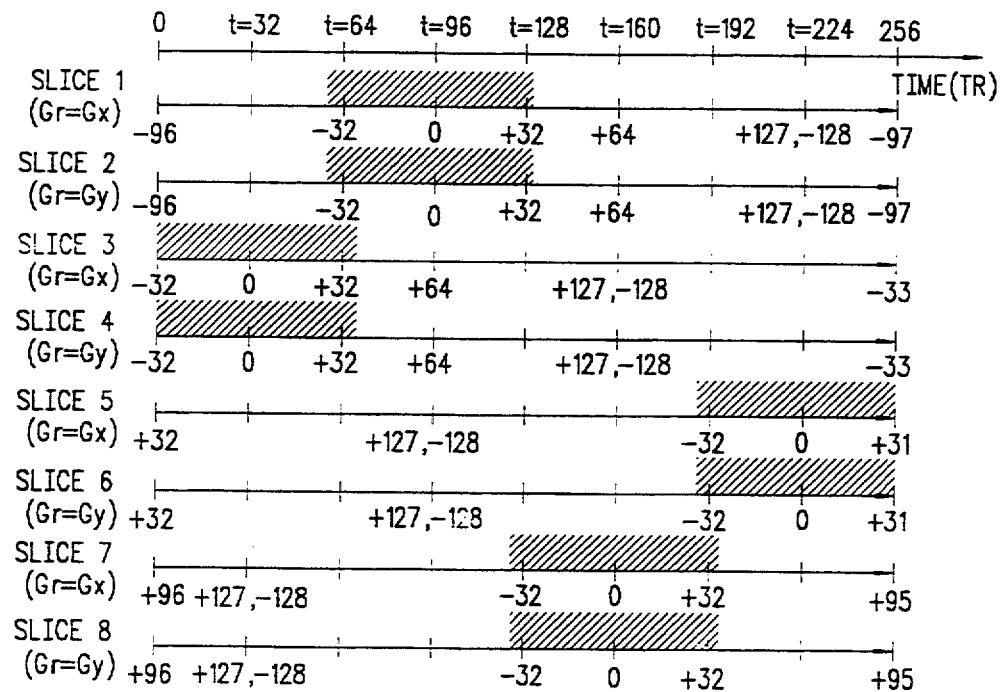

FIGS. 11A–11D depict various measurements according to the present invention. In FIG. 11A, the one-dimensional Fourier transform is shown for the 0th gradient, in a format similar to what is depicted in FIG. 8. The cross-correlation of these $h_o(x)$ with reference box-car functions is depicted in FIG. 11B, wherein zero x-axis displacement is determined from maxima. FIG. 11C is similar to FIG. 11A, except that a lower S/N phase encoding echo is shown, namely phase encoding number $-32$. The cross-correlation of what is shown in FIG. 11C is depicted in FIG. 11D. FIG. 11D is similar to what is shown in FIG. 11B except that there is now depicted an x-axis object displacement or about 20 pixels, in a rightward direction.

Modifications and variations may be made to the disclosed embodiments without departing from the subject and spirit of the invention as defined by the following claims.

What is claimed is:

1. For use with a magnetic resonance imaging system that scans an object divisible into at least one slice along a z-axis, wherein during a scanning time corresponding to a said slice that system subjects the object to a plurality of scans that each contain a sequence of transmitted radio frequency pulses and transmitted magnetic gradient pulses including low-order phase-encoding magnetic gradient pulses associated with a first axis and readout magnetic gradient pulses associated with a second axis orthogonal to said first axis, said first and second axes defining a plane orthogonal to said z-axis, and wherein during data acquisition the system uses return echoes acquired from a repetition of said sequence to reconstruct an slice of the object, a method for detecting and quantizing object movement along said second axis during said scanning time to permit compensating for such movement when reconstructing a said slice, the method comprising the following steps:

(a) arranging said phase-encoding magnetic gradient pulses in said sequence such that low-order phase-encoding magnetic gradient pulses are distributed substantially uniformly during said scanning time;

wherein during data acquisition, contributions from said low-order phase-encoding magnetic gradient pulses within said return echoes have sufficient signal-to-noise ratio to permit identification of object position along said second axis at more than one time during acquisition of a said slice of said object.

2. The method of claim 1, wherein said method further comprises the step of:

(b) for each contribution in said return echoes corresponding in time to a said low-order phase-encoding magnetic gradient pulse, calculating the modulus of the one-dimensional Fourier transform along said second axis;

wherein object position including relative change in position along said second axis is determinable from said modulus.

3. The method of claim 1, further including the step of:

(b) forming a reference box car function, associated with said slice, whose width along said second axis corresponds to said object's width at said slice;

said reference box car function being formed from the one-dimensional Fourier transform of a said return echo corresponding to a 0th-order said phase-encoding magnetic gradient pulse.

4. The method of claim 1, wherein said method further comprises the step of:

(b) for each contribution in said return echoes corresponding in time to a said low-order phase-encoding magnetic gradient pulse, calculating the modulus of the one-dimensional Fourier transform along said second axis;

(c) forming a reference box car function, associated with said slice, whose width along said second axis corresponds to said object's width at said slice, said box car function being formed from the one-dimensional Fourier transform of a said return echo corresponding to a 0th-order said phase-encoding magnetic gradient pulse; and (d) cross-correlating said modulus calculated in step (b) with said reference box car function formed in step (c) to obtain relative object position along said second axis at a time within said scanning time corresponding to acquisition of a said return echo corresponding to said low-order phase-encoding magnetic gradient pulse.

5. For use with a magnetic resonance imaging system that scans an object divisible into N slices spaced-apart along a z-axis, wherein for each of said N slices the system subjects the object to a plurality of scans that each contain a sequence of time-interleaved N sets of transmitted radio frequency pulses and transmitted magnetic gradient pulses including low-order phase-encoding magnetic gradient pulses associated with a first axis and readout magnetic gradient pulses associated with a second axis orthogonal to said first axis, said first and second axes defining a plane orthogonal to said z-axis, and wherein during data acquisition, the system uses return echoes acquired from a repetition of said sequence to reconstruct N slices of the object, a method for detecting and quantizing object movement along said second axis during said scanning time to permit compensating for such movement when reconstructing a set of N said slices, the method comprising the following steps:

(a) arranging each of said N sets of phase-encoding magnetic gradient pulses comprising said sequence such that at each scan time, at least one of said N sets contains low-order phase-encoding magnetic gradient pulse;

wherein during data acquisition, contributions from said low-order phase-encoding magnetic gradient pulses within said return echoes have sufficient signal-to-noise ratio to permit identification of object position along said second axis for each said slice; and wherein object position identification valid for one slice is substantially valid for each other slice when said slices are relatively adjacent physically in said object.

6. The method of claim 5, wherein said phase-encoding magnetic gradient pulses are arranged monotonically in said sequence for each of said N slices.

7. The method of claim 5, wherein said step (a) includes introducing a constant offset in sequence between adjacent ones of said N sets of phase-encoding magnetic gradient pulses.

8. The method of claim 5, further including the step of:

(b) for all return echoes from a said low-order phase-encoding magnetic gradient pulse, calculating the modulus of the one-dimensional Fourier transform along said second axis;

wherein object position including relative change in position along said second axis is determinable from said modulus.

9. The method of claim 5, further including the step of:

(b) forming N reference box car functions, associated with said N slices, whose widths along said second axis correspond to said object's width at each of said N slices; said N reference box car functions being formed from the one-dimensional Fourier transform of N echoes corresponding to N 0th-order said phase-encoding magnetic gradient pulses.

10. The method of claim 5, further including the step of:

(b) for all return echoes from a said low-order phase-encoding magnetic gradient pulse, calculating the modulus of the one-dimensional Fourier transform along said second axis;

(c) forming N reference box car functions, associated with said N slices, said reference box car functions having widths along said second axis corresponding to said object's width at each of said N slice; said N reference box car functions being formed from the one-dimensional Fourier transform of N echoes corresponding to N 0th-order said phase-encoding magnetic gradient pulse;

(d) cross-correlating each said modulus with an associated said reference box car function to obtain relative object position along said second axis at a time within said scan time corresponding to receipt of a said return echo corresponding to a said low-order phase-encoding magnetic gradient pulse; and (e) combining N relative object positions determined in step (d) to form a representation of object movement along said second axis during acquisition.

11. For use with a magnetic resonance imaging system that scans an object divisible into N slices spaced-apart along a z-axis, wherein for each of said N slices the system subjects the object to a plurality of scans that each contain a sequence of time-interleaved N sets of transmitted radio frequency pulses and transmitted magnetic gradient pulses and wherein during data acquisition, the system uses return echoes acquired from a repetition of said sequence to reconstruct N slices of the object, a method for detecting and quantizing object movement along first and second orthogonal axes that form a plane orthogonal to said z-axis, to permit compensating for such movement when reconstructing a set of N said slices, the method comprising the following steps:

(a) for all N=even numbered slices, transmitting a said sequence that includes low-order phase-encoding magnetic gradient pulses associated with said second axis, and transmitting readout magnetic gradient pulses associated with said first axis;

(b) for all N=odd numbered slices, transmitting a said sequence that includes low-order phase-encoding magnetic gradient pulses associated with said first axis, and transmitting readout magnetic gradient pulses associated with said second axis;

(c) for all N=even numbered slices, using a said return echo having a low-order phase-encoding magnetic gradient pulse contribution associated with said second axis to calculate a modulus of the one-dimensional Fourier transform along said first axis;

(d) for all N=odd numbered slices, using a said return echo having low-order phase-encoding magnetic gradient pulse contribution associated with said first axis to calculate a modulus of the one-dimensional Fourier transform along said second axis;

whereupon two-dimensional object position including relative change in position along said first axis and along said second axis is determinable.

12. The method of claim 11, wherein before transmitting a said sequence:

each of sand N=odd numbered sets of phase-encoding magnetic gradient pulses comprising said sequence is arranged such that at each scan time, at least one of said N=odd numbered sets contains a low-order phase-encoding magnetic gradient pulse; and each of said N=even numbered sets of phase-encoding magnetic gradient pulses comprising said sequence is arranged such that at each scan time, at least one of said N=even numbered sets contains a low-order phase-encoding magnetic gradient pulse.

13. The method of claim 11, wherein steps (a) and (b) include introducing a constant offset in sequence between adjacent ones of said N=even numbered sets and between adjacent ones of said N=odd numbered sets of phase-encoding magnetic gradient pulses.

14. The method of claim 11, further including the step of:

(e) forming N reference box car functions, associated with said N slices, whose widths along said orthogonal axis correspond to said object's width at each of said N slices; said N reference box car functions being formed from the one-dimensional Fourier transform of N echoes corresponding to N 0th-order said phase-encoding magnetic gradient pulses; wherein N=even numbered Fourier transforms are taken along said first axis, and wherein N=odd numbered fourier transforms are taken along said second axis.

15. The method of claim 11, further including the steps of:

(e) forming N reference box car functions, associated with said N slices, said reference box car functions having widths along said orthogonal axes corresponding to said object's width at each of said N slices; said N reference box car functions being formed from the one-dimensional Fourier transform of N echoes corresponding to N 0th-order said phase-encoding magnetic gradient pulse along a chosen said first or second axis associated with corresponding readout magnetic gradient pulses;

(f) cross-correlating each said modulus with an associated said reference box car function t obtain relative object position along said orthogonal axis at a time within said scan time corresponding to receipt of a said return echo corresponding to a said low-order phase-encoding magnetic gradient pulse; and (g) combining relative object positions determined in step (f) for N=even numbered slices to form a representation of object movement during acquisition along said first axis, and combining relative object positions determined in step (f) for N=odd numbered slices to form a representation of object movement during acquisition along said second axis.

16. The method of claim 11, wherein said phase-encoding magnetic gradient pulses are arranged monotonically in said sequence for each of said N slices.

17. For use with a magnetic resonance imaging system that scans an object divisible into at least one slice along a z-axis, wherein during a scanning time corresponding to a said slice the system subjects the object to a plurality of scans that each contain a sequence of transmitted radio frequency pulses and transmitted magnetic gradient pulses including low-order phase-encoding magnetic gradient pulses associated with a first axis and readout magnetic gradient pulses associated with a second axis orthogonal to said first axis, said first and second axes defining a plane orthogonal to said z-axis, and wherein during data acquisition the system uses return echoes acquired from a repetition of said sequence to reconstruct a slice of the object, a method for identifying object position, the method comprising the following steps:

(a) for each contribution is said return echoes corresponding in time to a said low-order phase-encoding magnetic gradient pulse, calculating the modulus of the one-dimensional Fourier transform along said second axis;

(b) forming a reference box car function, associated with said slice, whose width along said second axis corresponds to said object's width at said slice, said box car function being formed from the one-dimensional Fourier transform of a said return echo corresponding to a 0th-order said phase-encoding magnetic gradient pulse;

(c) cross-correlating said modulus calculated in step (b) with said reference box car function formed in step (c) to obtain relative object position along said second axis at a time within said scanning time corresponding to acquisition of a said return echo corresponding to said low-order phase-encoding magnetic gradient pulse; and (d) combining relative object positions determined in step (c) to form a representation of object movement along said second axis during acquisition.

* * * * *

UNITED STATES PATENT AND TRADEMARK OFFICE
CERTIFICATE OF CORRECTION

PATENT NO. : 5,323,110
DATED : June 21, 1994
INVENTOR(S) : Fielden et al.

It is certified that error appears in the above-identified patent and that said Letters Patent is hereby corrected as shown below:

In the Abstract, line 8, change "y" to --by--.

At column 4, line 29, after "directed to" insert --one or--.

At column 6, line 1, change "Applicants" to --Applicants'--.

At column 6, line 15, change "image" to --multi-image--.

At column 6, line 17, after "four" insert --of eight--.

At column 6, line 19, delete "by repeating these four slice".

At column 6, line 29, after "For" delete "the".

At column 6, line 29, before "embodiment" insert --a single slice imaging--.

At column 6, line 29, after "embodiment" delete "depicted in Fig. 4".

At column 6, line 30, delete "in a single slice".

At column 6, line 68, change "respective" to --respectively--.

At column 7, line 1, before "slice" insert --scanned--.

At column 7, line 1, change "slice" to --slices--.

At column 7, line 1, delete "same respective" and insert —corresponding—.

At column 7, line 5, change "slice" to --echo--.

At column 7, line 6, change "slice" to --echo--.

UNITED STATES PATENT AND TRADEMARK OFFICE
CERTIFICATE OF CORRECTION

PATENT NO. : 5,323,110

DATED : June 21, 1994

INVENTOR(S) : Fielden et al.

It is certified that error appears in the above-identified patent and that said Letters Patent is hereby corrected as shown below:

At column 8, line 9, delete "this" and insert --the second--.

Signed and Sealed this

Second Day of January, 1996

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,323,110

Page 1 of 4

DATED : June 21, 1994

INVENTOR(S) : Fielden et al.

It is certified that error appears in the above-identified patent and that said Letters Patent is hereby corrected as shown below:

The Title page, showing an illustrative figure, should be deleted and substitute therefor the attached Title page.

Figure 3A:
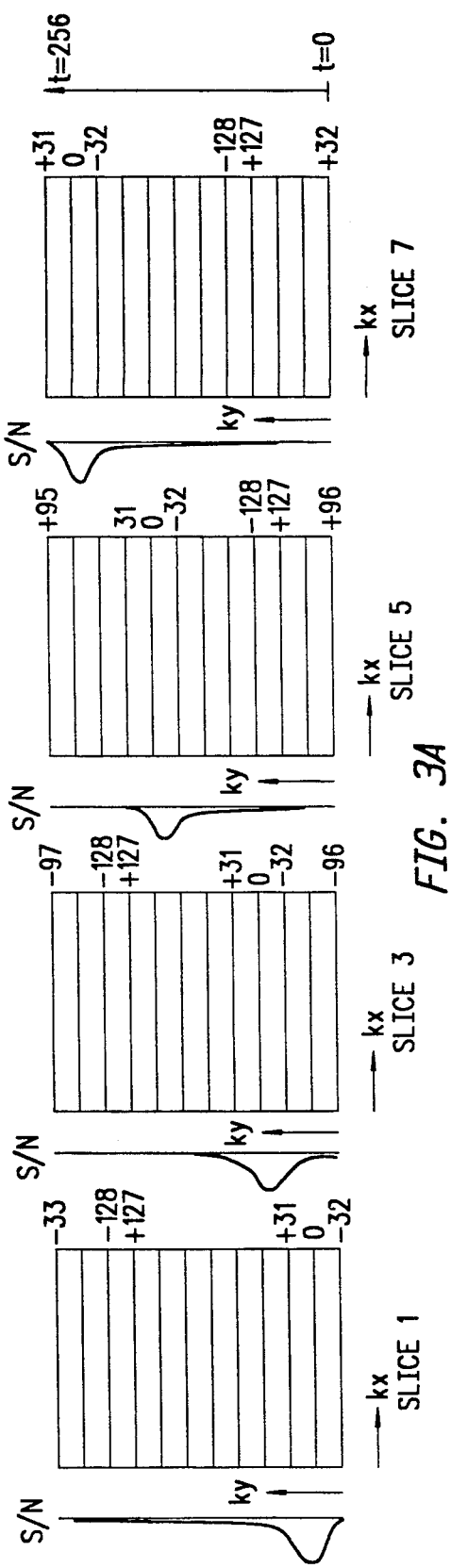
FIG. 3A depicts a k-space data matrix for slices 1, 3, 5 and 7, showing acquisition order for recording motion in the x-axis direction for an MRI signal processing system, according to the present invention.
Figure 3B:
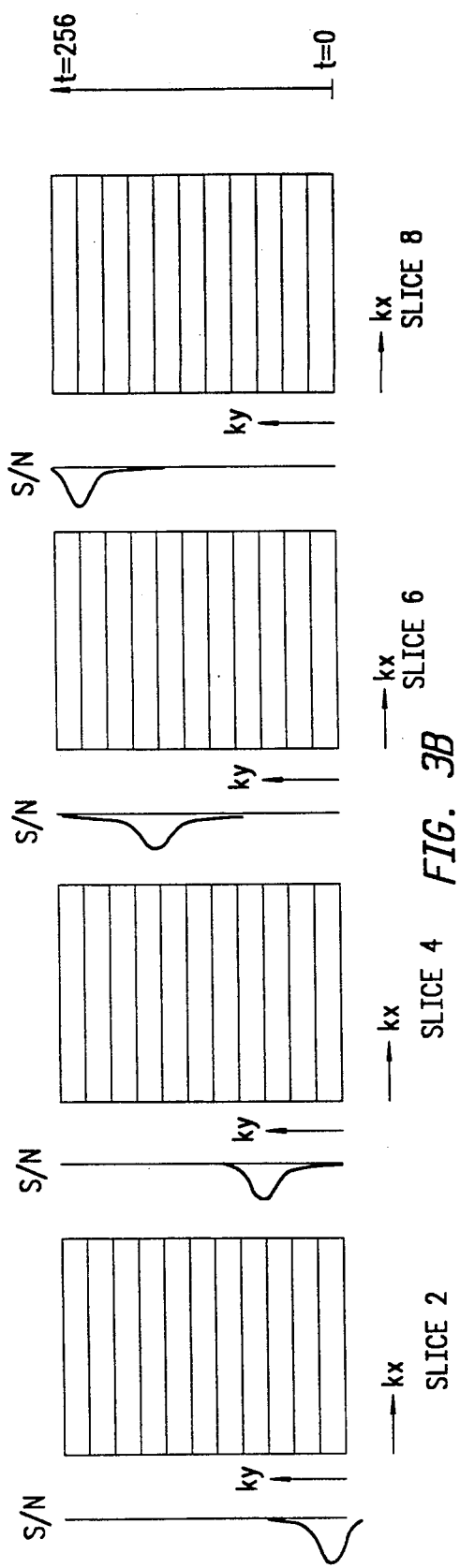
FIG. 3B depicts k-space data matrix for slices 2, 4, 6 and 8, showing acquisition order for recording motion in the y-axis direction for an MRI signal processing system, according to the present invention.

Delete drawing sheet 3 of 11, and substitute therefor the drawing sheet consisting of Figs. 3A and 3B, as shown on the attached page.

Delete drawing sheet 5 of 11, and substitute therefor the drawing sheet consisting of Fig. 5, as shown on the attached page.

Signed and Sealed this

Twenty-fifth Day of June, 1996

Attest:

BRUCE LEHMAN

*Attesting Officer*   *Commissioner of Patents and Trademarks*

United States Patent [19]
Fielden et al.

[11] Patent Number: 5,323,110
[45] Date of Patent: Jun. 21, 1994

[54] TECHNIQUE FOR COMPENSATING FOR PATIENT MOTION IN MAGNETIC RESONANCE IMAGING

[75] Inventors: John Fielden; Li-Hsin Zang, both of San Jose; Jacob Wilbrink, Sunnyvale, all of Calif.

[73] Assignee: Hitachi Instruments, Inc., San Jose, Calif.

[21] Appl. No.: 927,321

[22] Filed: Aug. 10, 1992

[51] Int. Cl.⁵ .............................................. G01V 3/00
[52] U.S. Cl. ............................... 324/309; 324/307
[58] Field of Search ............ 324/300, 307, 309, 311, 324/312, 306

[56] References Cited

U.S. PATENT DOCUMENTS

| | | | |
|---|---|---|---|
| 4,800,494 | 1/1989 | Foxall | 324/309 |
| 4,937,526 | 6/1990 | Ehman et al. | 324/309 |
| 4,978,918 | 12/1990 | Sakamoto | 324/309 |
| 5,168,226 | 12/1992 | Hinks | 324/309 |

Primary Examiner—Louis Arana
Attorney, Agent, or Firm—Flehr, Hohbach, Test, Albritton & Herbert

[57] ABSTRACT

In a magnetic resonance imaging system, object movement along an axis associated with readout magnetic gradient pulses is detected, quantized and compensated for in reconstructing an image slice. Phase-encoding magnetic gradient pulses in the sequence are arranged so that low-order phase-encoding pulses are distributed substantially uniformly during scanning time. In an N-slice acquisition, object movement is determined by arranging each of the N sets of phase-encoding gradient pulses comprising a multi-slice sequence such that at each scan time, at least one of the N sets contains a low-order phase-encoding gradient pulse. During data acquisition, echoes returned from low-order phase-encoding gradient pulses have sufficient signal-to-noise ratios to identify object position along the readout axis. Identification of object movement from one slice may be valid for other slices relatively adjacent physically in the object, so that all N slices are movement corrected during image reconstruction. Two-dimensional object position may also be identified and corrected by suitably exchanging the axes of N sets of pulses within a sequence. For a single slice acquisition, object position may be identified when scans associated with low-order phase-encoding gradient pulses are distributed evenly during imaging. After one-dimensional Fourier transformation, object position relative to a reference box function is determined using cross-correlation.

17 Claims, 11 Drawing Sheets

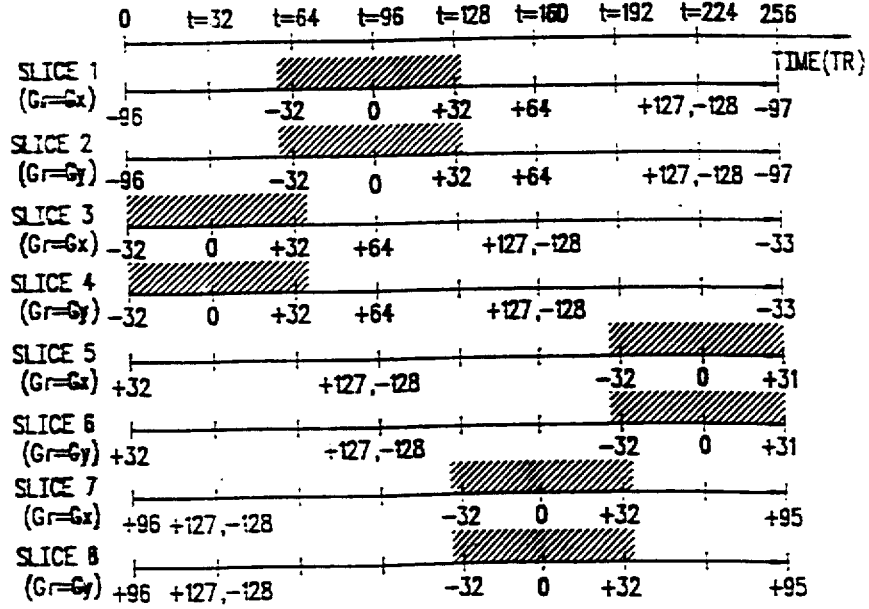

PHASE ENCODING ORDER

PHASE ENCODING ORDER